United States Patent [19]

Moore et al.

[11] Patent Number: 4,703,567
[45] Date of Patent: Nov. 3, 1987

[54] CONNECTION OF ELECTRICAL COMPONENT AND ITS HEAT SINK

[75] Inventors: Alan R. Moore; Graham W. Simcox, both of Sutton Coldfield; Allan K. Thomas, Birmingham, all of England

[73] Assignee: Lucas Electrical Electronics and Systems Limited, Birmingham, England

[21] Appl. No.: 902,636

[22] Filed: Sep. 2, 1986

[30] Foreign Application Priority Data

Sep. 6, 1985 [GB] United Kingdom ................ 8522159

[51] Int. Cl.$^4$ .......................... H05K 7/02; H05K 7/04
[52] U.S. Cl. .................................... 361/417; 361/418; 361/386
[58] Field of Search ............... 361/403, 418, 417, 388, 361/386, 381, 383, 389

[56] References Cited

U.S. PATENT DOCUMENTS 3,801,874 4/1974 Stefani ................................ 361/388
4,509,096 4/1985 Baldwin ............................. 361/386
4,561,011 12/1985 Kohara et al. ...................... 361/386
4,575,038 3/1986 Moore ................................ 361/383

Primary Examiner—Roy N. Envall, Jr.
Attorney, Agent, or Firm—Nixon & Vanderhye

[57] ABSTRACT

A heat generating electrical device is connected to a heat sink of metal. An element, preferably formed of copper or silver and plated to increase ease of soldering and corrosion resistance, is mechanically anchored in the thickness of a heat sink (e.g. of aluminum or steel) so that part of the element is accessible. Then the electrical component is soldered to the accessible part of the element. The mechanical anchoring may be accomplished by punching, drilling, or the like, and locating in the hole so formed a copper stud having a head abutted against a plate, and then compressing the assembly mechanically to anchor the stud in the plate, with the electrical components soldered to the stud head.

11 Claims, 3 Drawing Figures

CONNECTION OF ELECTRICAL COMPONENT AND ITS HEAT SINK

The invention relates to the connection of a heat generating electrical component such as a semi-conductor device and a heat sink formed of a metal to which the device cannot readily be connected by soldering. There is a tendency to incorporate greater numbers of electrical components in an automotive vehicle. Such components must be connected to a heat sink to dissipate the heat generated in use of the vehicle. Under onerous conditions heat and vibration can cause failure of a solder connection between the component and the heat sink. As a typical example, the heat sink may be formed of aluminium which is a popular material for a heat sink because it is cheaper than copper but is still an effective heat conductor.

It is known that electronic devices cannot readily be soldered to aluminuim. To make a satisfactory connection it has been proposed to use a highly active flux, roll a copper strip into the aluminium during manufacture, plate on a layer of copper or nickel or ultrasonically weld on a copper pad. All these techniques have disadvantages for example, by being costly or required to be performed under closely controlled conditions, or subject to corrosion.

There is a need for a reliable, simple and cheap method of connecting a component and the heat sink therefor in such a way that the solder connection can withstand heat and other forces tending to break the connection.

According to a first aspect of the invention there is provided a method of connecting a heat generating electrical component and a heat sink therefor, the heat sink being formed of a metal to which the component cannot readily be soldered, the method comprising mechanically anchoring an element in the thickness of the heat sink such that part of the element is accessible, the element being formed of a metal to which the electrical component can readily be soldered, and soldering the electrical component to the accessible part.

Most preferably the element is in the form of a stud having a shank and a head, and the shank is mechanically anchored in a preformed hole in the heat sink by being peened or otherwise mechanically secured thereto.

The element may be formed of any metal to which the electrical component can be soldered and the assembly may be incorporated in a wide variety of electrical items such as a Bridge Rectifier or the like. The element can be formed of a suitable metal or alloy, preferred examples being copper, silver, or the like. The element may be plated e.g. by silver, tin, or gold, to increase the ease of soldering and corrosion resistance.

The material of which the heat sink is made will depend on the power of the electric component which determines the amount of heat evolved. Usually the heat sink will be made of aluminium, but for a low power component, the heat sink may be made of a steel such as mild steel and stainless steel. It is an advantage of the invention that a heat sink having a decorative finish e.g. a bright nickel plating, which a solder will not bond, may be used.

A connection of the invention can be subjected to thermal cycling ranging from −40° C. to 175° C. without failure.

In a preferred aspect the invention provides a method as defined including the steps of making a hole e.g. by punching, drilling or the like in an aluminium plate heat sink, locating in the hole the shank of a copper stud having a head which is abutted against one face of the plate, compressing the assembly mechanically to anchor the stud to the plate and then soldering the electrical component to the stud head.

The invention includes a heat sink having an element anchored in the thickness thereof such that a part of the element is accessible for soldering; and a heat sink as defined having a heat generating device soldered to the accessible part of the element anchored in the thickness of the heat sink.

In order that the invention may well be understood it will now be described, by way of example only, with reference to the accompanying diagrammatic drawings, in which FIG. 1 is a sectional view of an assembly before compression;

A hole 1 is formed through the thickness of an aluminium plate P acting as a heat sink. A stud S comprising a shank 2 and a flat head 3 is formed of copper. The shank 2 is longer than the depth of the plate P and the head 3 is about twice the diameter of the hole 1. In a typical embodiment, the aluminium heat sink P may be 3 mm thick and the hole is about 3.3 mm in diameter. The copper stud S may have a flat head 3 about 6 mm in diameter and 1 mm thick with the shank 2 having a diameter of 3 mm and a length of about 3.5 mm.

Figure 1:
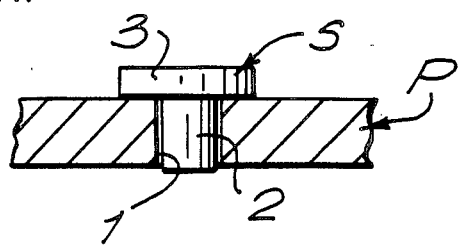
Figure 2:
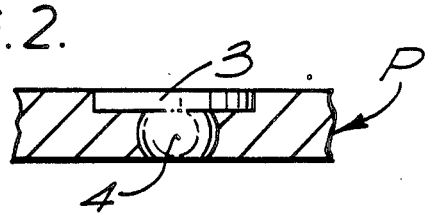
FIG. 2 is the same view after compression.
Figure 3:
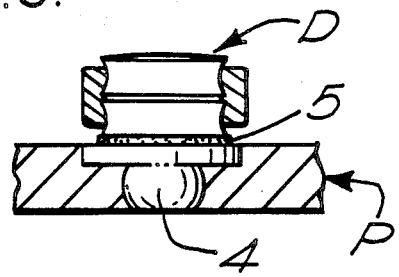
FIG. 3 is a more detailed view drawn to an enlarged scale.

In use, the assembly of heat sink containing a stud S in the hole 1 is compressed or swaged between two flat dies not shown, and to the condition of FIG. 2. The compression causes the stud and the plate to be deformed and the stud to expand so that the vertical middle portion 4 is of generally barrel shape. The expanded middle portion 4 not only defines a retention key with the complementary hole wall of the deformed aluminium plate whereby part of the stud is mechanically anchored in the thickness of the plate but also provides good thermal and electrical conductivity. The head 3 of the stud S is keyed in the upper region of the plate P. In this way the stud S and the plate P are mechanically secured together. A semiconductor device D such as a button diode is soldered by solder 5 to the upper flat surface of the head 3 of the stud, to hold the device and its heat sink in tight engagement. In this way a tenacious connection resistant to thermal cycling had been made in a simple, reliable and cheap way.

We claim:

1. A method of electrically and thermally connecting a heat generating electrical component and a heat sink therefor, the heat sink being formed of a metal to which the component cannot readily be soldered, the method comprising the steps of:

mechanically anchoring an element in the thickness of the heat sink such that part of the element is accessible, the element being formed of a metal to which the component can be soldered; and soldering the electrical component to the accessible part;

whereby the component and the heat sink are connected electrically and thermally.

2. A method according to claim 1 wherein the element is in the form of a stud having a shank and a head, and the shank is located in a preformed hole in the heat sink and then mechanically anchored therein.

3. A method according to claim 2 wherein the shank of the element is peened to the heat sink.

4. A method according to claim 1 wherein the element is formed of copper or silver, and is optionally plated to increase the ease of soldering and corrosion resistance.

5. A method according to claim 1 wherein the heat sink is formed of aluminium or steel.

6. A method according to claim 1 including making a hole by punching, drilling or the like in an aluminium plate heat sink, locating in the hole the shank of a copper stud having a head which is abutted against one face of the plate, compressing the assembly mechanically to anchor the stud and the plate and then soldering the electrical component to the stud head.

7. A method according to claim 6, wherein the compression causes deformation of the element and the heat sink to key these parts together.

8. An assembly comprising:
a heat sink;
a heat generating electrical device connected to said heat sink, the heat sink being formed of a metal to which the device cannot readily be soldered;
an element which is mechanically anchored in the thickness of the heat sink, the element being formed of a metal to which the device can be soldered; and
solder connecting the device electronically and thermally to the element, and through the element electrically and thermally connected to the heat sink.

9. An assembly according to claim 8 wherein the heat sink is formed of aluminium or steel and the element is formed of copper or silver or plated copper or silver.

10. An assembly according to claim 8 wherein a preformed hole is present in the heat sink and a part of the element is received in the hole and the heat sink and the element have been compressed together whereby the part of the element is engaged with the wall of the hole and thereby mechanically anchored therein.

11. A heat sink comprising a sheet of metal selected from the group consisting of aluminium and steel and for electrical and thermal connection to a heat generating electrical component, which component cannot readily be soldered to the heat sink; the heat sink including a preformed hole having a side wall, and an element received in the hole and mechanically anchored therein by compression of the element so that a peripheral portion of the element is deformed to engage the side wall of the hole, and the side wall of the hole is also deformed, part of the element being accessible from outside the hole, and the element being formed of an electrically and thermally conductive metal to which the component can be readily soldered.

* * * * *